United States Patent [19]

Sakakura et al.

[11] 4,336,120
[45] Jun. 22, 1982

[54] METHOD OF FABRICATING A ZINC OXIDE THIN FILM

[75] Inventors: Mitsuo Sakakura, Sakado; Tetsuo Takaku, Tsuru-gashima, both of Japan

[73] Assignee: Toko, Inc., Tokyo, Japan

[21] Appl. No.: 240,578

[22] Filed: Mar. 4, 1981

Related U.S. Application Data

[63] Continuation-in-part of Ser. No. 59,340, Jul. 23, 1979, abandoned.

[30] Foreign Application Priority Data

Jul. 21, 1978 [JP] Japan ................................. 53-89163

[51] Int. Cl.³ ............................................. C23C 15/00
[52] U.S. Cl. ........................... 204/192 SP; 252/62.9; 427/100
[58] Field of Search ............. 204/192 SP; 252/62.9 R; 427/100

[56] References Cited

U.S. PATENT DOCUMENTS

| | | | |
|---|---|---|---|
| 3,766,041 | 10/1973 | Wasa et al. ..................... | 204/192 SP |
| 4,142,124 | 2/1979 | Ogawa et al. ..................... | 310/360 |
| 4,151,324 | 4/1979 | Ogawa et al. ..................... | 428/432 |
| 4,156,050 | 5/1979 | Ogawa et al. ..................... | 428/432 |
| 4,164,676 | 8/1979 | Nishiyawa et al. ............... | 310/360 |

OTHER PUBLICATIONS

K. Wasa et al., Proc. 6th Internl. Vacuum Congr. 1974, Japan J., Appl. Phys., Suppl. 2, Pt. 1, 1974, pp. 745–A, Surface Wave Transducers of ZnO.

Primary Examiner—Veronica O'Keefe
Attorney, Agent, or Firm—Schwartz, Jeffery, Schwaab, Mack, Blumenthal & Koch

[57] ABSTRACT

A method of fabricating a zinc oxide thin film by a sputtering process, wherein a substance, such as boron, having an ion radius smaller than that of zinc is sputtered in an oxygen atmosphere. A body of zinc and a body of such a substance may be separately provided as targets of a cathode so that such separate targets may be simultaneously sputtered to thereby produce a thin film such as mentioned above. Alternatively, use may be made of a cathode provided with a zinc target having a substance buried therein which has an ion radius smaller than that of zinc.

6 Claims, 2 Drawing Figures

METHOD OF FABRICATING A ZINC OXIDE THIN FILM

This application is a continuation-in-part of copending application Ser. No. 059,340 filed July 23, 1979, abandoned.

The present invention relates to a method of fabricating zinc oxide thin films which are piezoelectric thin films capable of being employed to make elastic surface wave elements or the like.

An elastic surface wave element is an element in which input and output electrodes, which are constituted by interdigital electrodes, are provided on a propagation medium of the piezoelectric nature, thereby effecting electro-mechanical and mechanical-electric signal conversions. Such elements have been used as filters, delay lines and so forth through utilization of the frequency characteristics and delay time characteristics thereof.

The piezoelectric materials which have been employed as materials for elastic surface wave elements at present may be classified into the following three categories: Monocrystalline piezoelectric materials; piezoelectric ceramics; and piezoelectric thin films. However, each of these materials has advantages and disadvantages. More specifically, monocrystalline piezoelectric materials have such disadvantages that the cost thereof is high and the dependence on temperature of the velocity of elastic surface wave propagating therealong is remarkable; piezoelectric ceramics are disadvantageous in that irregularities occur in the material constants thereof; and piezoelectric thin films are disadvantageous in that reproducibility in fabrication is difficult to achieve.

Though each of the foregoing three materials has such disadvantages as mentioned just above, it is considered that from the standpoint of cost and retention of characteristics as well as available frequency range, piezoelectric thin films are the most useful materials on the assumption that the problems with the fabrication thereof are solved. A variety of piezoelectric thin films are available which may be formed from zinc oxide, cadmium sulfate or the like. Among these materials, zinc oxide is considered most suitable from the standpoint of high electro-mechanical coupling coefficient and safety with respect to the human body.

In elastic surface wave elements using a piezoelectric thin film of zinc oxide, it is the usual practice that such a thin film is provided on an insulating material, such as glass, which has interdigital electrodes provided thereon. The piezoelectric thin film is formed by vapor-depositing zinc oxide onto the glass substrate. A variety of vapor-deposition processes are available, the most commonly used one of such methods is a sputtering method.

There are available various types of sputtering processes; the two-pole DC reaction type of sputtering process has most commonly been employed wherein argon and oxygen gases are introduced into a highly evacuated bell jar as inert gas and active gas respectively; an anode is provided which has a substrate of an insulating material, such as glass, mounted thereon; and a cathode is provied which has a target of zinc mounted thereon. In such a process, a DC electric field is applied between the anode and the cathode to produce a plasma discharge by which the argon gas is ionized to make $Ar^+$ which in turn is caused to collide with the cathode. Such collisions result in a sputtering effect by which zinc molecules will be driven out into the bell jar. The zinc molecules thus driven out will in turn be implanted into the substrate of the anode by the sputtering energy while at the same time being caused to react with the oxygen activated in the plasma discharge so that zinc oxide will be produced which will in turn be caused to adhere to the substrate of the anode, thus resulting in a crystal being grown.

In order to ensure than an elastic surface wave element has a sufficient conversion efficiency, it is essential to sufficiently increase the electromechanical coupling coefficient of the zinc oxide thin film used therewith. To this end, the thickness of such a film should be made to have a greater magnitude than a predetermined value. In the case of an elastic surface wave element to be used as 58 MHz VIF filter for color television, for example, such film thickness should be made greater than 20 $\mu$m for the purpose of increasing the electro-mechanical coupling coefficient to thereby decrease insertion loss.

However, when a thin film of zinc oxide having a thickness of 20 $\mu$m was vapor-deposited on a glass substrate, such a situation occurred that the glass substrate was damaged. Moreover, there also occurred a situation that the thin film of zinc oxide peeled off the glass substrate instead of the substrate being fractured. Such two situations were selectively caused by changing the oxygen pressure during the manufacturing steps in the sputtering process.

Accordingly, it is an object of the present invention to provide a method of fabricating a piezoelectric thin film wherein a glass substrate is prevented from being damaged even when the piezoelectric thin film is formed thereon as a film of a thickness greater than 20 $\mu$m, thus solving the aforementioned problems.

Another object of this invention is to provide a method of fabricating a zinc oxide thin film which neither causes a glass substrate, on which such a thin film is provided, to be damaged nor tends to peel off the glass substrate.

Other objects, features and advantages of the present invention will become apparent from the ensuing description taken in conjunction with the accompanying drawings.

The causes for the above-mentioned problems may be considered to reside in the crystal structure of zinc oxide. In zinc oxide, oxygen and zinc are bonded together through a covalent bond (II–VI bond) with a strong ionic nature, and its crystal structure is of the hexagonal system. That is, the zinc and oxygen array planes are perpendicular to the C-axis and are alternately arranged along the C-axis so as to represent a wurtz type structure. Thus, zinc and oxygen are arranged in alternate planes on a common straight line perpendicular to the C-axis. When a thin film of zinc oxide is formed by a sputtering process, a pillar-like crystal is caused to grow in a direction perpendicular to the glass substrate surface. This direction of growth coincides with the C-axis.

A comparison of the oxygen planes and the zinc planes in the crystal structure reveals that the spacing between the oxygen planes is greater than that between the zinc planes so that as the zinc oxide thin film builds up, the oxygen planes and the zinc planes become deviated from each other in terms of positional relationship therebetween. It may be considered that such a deviation causes oxygen in the sputtering atmosphere to enter the crystal of zinc oxide, thereby resulting in deterioration of the crystal structure. In other words, by the fact that excess oxygen molecules are caused to enter the crystal, the aforementioned arrangements of zinc and oxygen are disturbed, which will have a detrimental effect on the crystal growing direction. i.e., orientation of C-axis. Thus, the crystal growing direction will become oblique and irregular with respect to the surface of the glass substrate rather than perpendicular with respect thereto. As a result of investigations of fractured glass substrates, it has been observed that the crystal growing direction therein has become irregular and that the substrates have been fractured at the points where irregular crystal growth has occurred.

Figure 1:
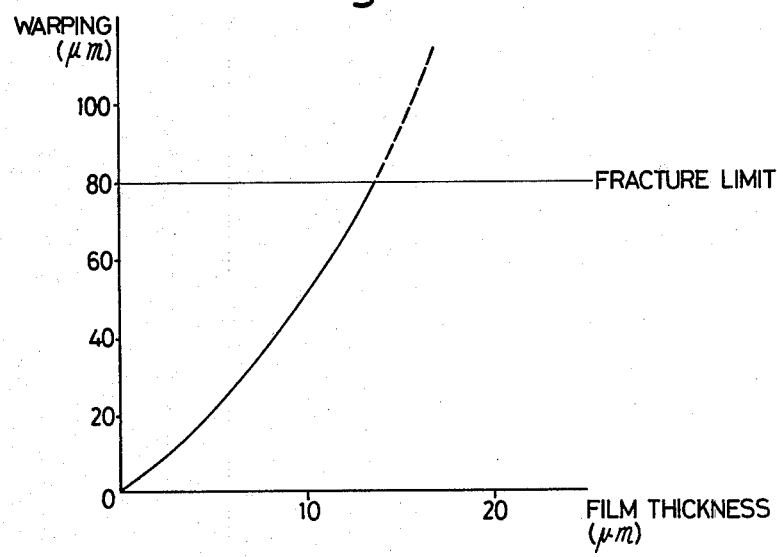
FIG. 1 is a graph illustrating the relationship between the thickness of a zinc oxide thin film and the extent to which a glass substrate is warped when the zinc oxide thin film is formed on the glass substrate by a prior-art process.

The phenomena which have been encountered with the prior art techniques can best be explained by regarding that the crystal structure is deteriorated due to distortion occurring in the crystal of zinc oxide so that an internal stress is caused to occur therein and applied to the glass substrate whereby the latter is fractured. When the thickness of a zinc oxide thin film is no greater than 5 $\mu$m, such an internal stress is so low that there will occur no distortion great enough to cause the substrate to be fractured, whereas when such a thickness is made greater than 10 $\mu$m, the internal stress builds up correspondingly so that the glass substrate will be fractured when such a stress goes beyond the endurance limit of the substrate. In the case where a zinc oxide thin film is formed by a sputtering process wherein an alkaline glass substrate having a thickness of 0.5 mm is maintained at a temperature of 110° C. with a gas pressure of $1.85 \times 10^{-2}$ Torr, the warping of the glass substrate increases as the thickness of the thin film increases, as will also be seen from the graph of FIG. 1. With a zinc oxide thin film having the crystal structure thereof particularly remarkably deteriorated, it occasionally happens that the glass substrate is fractured even before the warping thereof reaches the breaking limit.

Glass substrates 0.5 to 0.75 mm thick are usually employed; however, such glass substrates should be as thin as possible since if a glass substrate having a greater thickness is used to secure a sufficient strength, then not only will the element become bulky but also working operations, such as cutting, will become difficult. In addition, it is desirable that the internal stress tending to occur in the zinc oxide thin film be reduced by means of improvements in the crystal structure per se.

By increasing the gas pressure in a sputtering process up to $1 \times 10^{-1}$ Torr in an attempt to prevent the occurrence of internal stress, the adherence of the zinc oxide thin film to the glass substrate was weakened so that the thin film became liable to peel off the glass substrate. In such a case, it has been found that the crystal of the zinc oxide thin film has become liable to be subject to cleavage so that the bond in the direction of the C-axis has been weakened.

By changing the conditions for sputtering, the crystal structure of a zinc oxide thin film which is permitted to grow on a glass substrate, is slightly changed. However, in order to achieve an enhanced productivity while at the same time securing characteristics which make the zinc oxide thin film usable for an elastic surface wave element, it is required that the structure of the thin film be changed, or that a dopant material or materials be doped into the thin film.

In order to reduce the internal stress resulting from distortion of the crystal structure, such crystal structure distortion should either be reduced or absorbed in any desired manner.

As mentioned above, zinc oxide has a hexagonal system crystal structure, and its lattice represents a wurtzite type structure wherein the oxygen lattice and the zinc lattice are mingled together. The fact that the spacing between the oxygen lattice planes and that between the zinc lattice planes are different from each other, constitutes the case for distortion in the crystal structure. Thus, it is necessary that a substance or substances capable of compensating for the difference between the spacings be doped into the crystal in an attempt to reduce such distortion.

In the course of investigations conducted in search for a substance or substances capable of compensating for the difference between the aforementioned spacings, the inventors have found out that in a zinc oxide thin film formed through the use of a dopant material, the ion radius of the element used as the dopant material has a remarkable effect on the crystal structure of the resulting thin film.

It has been observed that the crystal structure of a zinc oxide thin film having an element doped therein which has an ion radius smaller than the ion radius of zinc which is 0.71 Å, is less distorted. More specifically, by vapor-depositing onto a glass substrate a zinc oxide thin film including such a substance as dopant material by means of a sputtering process, it is possible not only to prevent the glass substrate from being fractured but also reduce the warping of the glass substrate.

The elements having a smaller ion radius than that of zinc include beryllium (Be; 0.33 Å), magnesium (Mg; 0.66 Å), boron (B; 0.21 Å), silicon (Si; 0.40 Å), germanium (Ge; 0.50 Å), gallium (Ga; 0.59 Å) and so forth.

In order that a substance having a smaller ion radius than that of zinc such as mentioned above may be doped, zinc constituting the cathode is sputtered with such a substance in a sputtering process so as to be vapor-deposited onto the substrate of the anode. To this end, it is the usual practice either to form the cathode target of an alloy of zinc and such a substance or individually mount a target of zinc and a target of such a substance on the cathode. A desired zinc oxide thin film has been obtained even with such a simple structure that a dopant material is buried in a suitable aperture or apertures formed in the zinc target.

Upon occurrence of a plasma discharge, argon gas is thereby ionized, and the resultant ions collide with the target of the cathode. Consequently, the zinc and dopant material are driven out into the bell jar by the sputtering effect. In turn, the molecules of the zinc and dopant material thus driven out are permitted to react with oxygen and deposited onto the substrate, thus resulting in a crystal being grown.

The crystal structure of a zinc oxide thin film having a substance doped therein which has an ion radius smaller than that of zinc, turns out to be a structure wherein the dopant material is at least partially substituted for zinc and solid-dissolved therein, by virtue of the fact that the distortion therein is reduced so that the internal stress is also reduced. Substances having an ion radius smaller than that of zinc range from divalence to tetravalence, as electrically viewed. Thus, the degree of substitution and solid-dissolution as well as the electrical properties of a zinc oxide thin film including a substance whose ion radius is smaller than that of zinc, also differ from one such substance to another. For example, beryllium, which is of divalence and has a wurtz type structure, is completely substituted for zinc and solid-dissolved therein; thus, it has no influence on the resistivity of the zinc oxide thin film. With boron or gallium, which is of trivalence, however, the quantity of such an element which can be substituted and solid-dissolved is limited so that as the quantity of the element doped in a zinc oxide thin film increases, the resistivity of such a thin film becomes lower.

With a zinc oxide thin film grown on a glass substrate by sputtering a substance whose ion radius is smaller than that of zinc, together with zinc as mentioned above, the glass substrate was never fractured due to the formation of the thin film thereon even when such a film was as thick as 20 $\mu$m. The reason for this may be considered to be that the crystal structure of the zinc oxide thin film is changed so that internal stress occurring therein is reduced, by sputtering a substance whose ion radius is smaller than that of zinc, together with the zinc.

In fact, the crystal structure of a zinc oxide thin film which is produced by sputtering a substance whose ion radius is smaller than that of zinc, together with zinc by means of a sputtering process, is not yet known. The only thing that is conceivable at the present time is that substitution of part of the zinc in a zinc oxide thin film with a substance having an ion radius smaller than that of zinc relieves the internal stress or distortion whereby the difference between the oxygen plane spacing and the zinc plane spacing is compensated so that formation of normal zinc and oxygen arrangements is promoted as a whole.

The ion radius differs from one substance to another, and therefore the optimum quantity of the substance to be doped in the thin film also differs from one such substance to another. In the case of a substance such as beryllium or boron which has a relatively small ion radius, only a small quantity of such a substance must be doped to produce a satisfactory effect, whereas in the case of a substance whose ion radius is substantially equal to that of zinc, a larger quantity of such a substance is required to be doped to produce a satisfactory effect. Generally, the amount of dopant in the resulting thin film of zinc oxide will be from 0.1 atom % to 10 atom %.

The quantity of the substance to be doped should be minimized in view of the fact that the more such a quantity, the more effectively the internal stress can be absorbed but the lower the resistivity of the film becomes. Especially in the case where the substance to be doped is of trivalence or tetravalence, care should be taken to reduce the quantity of such a substance as much as possible.

It has been found that the quantity of the substance incorporated into the zinc oxide film according to the present invention is proportional to the quantity of the substance which is doped into the target and then sputtered. In fact, the quantity of the sputtered substance, which equals the quantity of the substance contained in the target multiplied by the sputtering rate, was approximately equal to the quantity of the substance incorporated in the resulting thin film. In one case where 2% boron expressed in area ratio (about 4 atom %) was doped into the target, the boron was sputtered at a rate of 30% with respect to the zinc. The boron incorporated into the resultant thin film was 0.19 weight percent with respect to the zinc which corresponds to about 1.15 mole percent with respect to the zinc.

The properties of a zinc oxide thin film formed on a glass substrate according to the present invention vary depending not only on the quantity of the doped substance which has an ion radius smaller than that of zinc but also the gas pressure within the bell jar and the temperature of the glass substrate.

Table I illustrates the results which were obtained by doping boron in the target at a substrate temperature of 110° C. and gas pressure of $1.85 \times 10^{-2}$ Torr.

TABLE I

| Dopant Quantity (Atom %) | Film Thickness ($\mu$m) | Warping ($\mu$m) | Insertion Loss (dB) | Orientation of C-axis (X) (degree) | Resistivity ($\Omega$ cm) |
|---|---|---|---|---|---|
| 0% | 10 | 80 | 48 | 5 | $10^6$ |
|  | 20 | Fractured |  |  |  |
| 0.2% | 20 | 40 | 33 | 3 | $10^9$ |
| 2.0% | 20 | 2 | 29 | 3 | $10^{10}$ |
| 10.0% | 20 | 20 | 33 | 5 | $10^8$ |
| 15.0% | 20 | 60 | 45 | 15 | $10^5$ |

As will be seen from Table I, when no doping was effected, with a film thickness of 10 $\mu$m, the glass substrate was warped as greatly as 80 $\mu$m, and with a film thickness of 20 $\mu$m, the glass substrate was fractured. In constrast thereto, by doping boron, the extent of warping was reduced, and a minimum of warping was achieved when 2 atom % to 3 atom % boron was doped into the target. A further increase in the dopant quantity produced the reverse result that the extent of warping was increased.

With an elastic surface wave element using a zinc oxide thin film produced according to the present invention, as the quantity of boron doped was increased, the resistivity was increased while the insertion loss was reduced. A minimum of insertion loss was attained when the quantity of the dopant in the target was in the range of from 2 atom % to 3 atom %. A further increase in the dopant quantity resulted in a higher insertion loss; a dopant quantity in excess of 10 atom % made the element practically useless.

Figure 2:
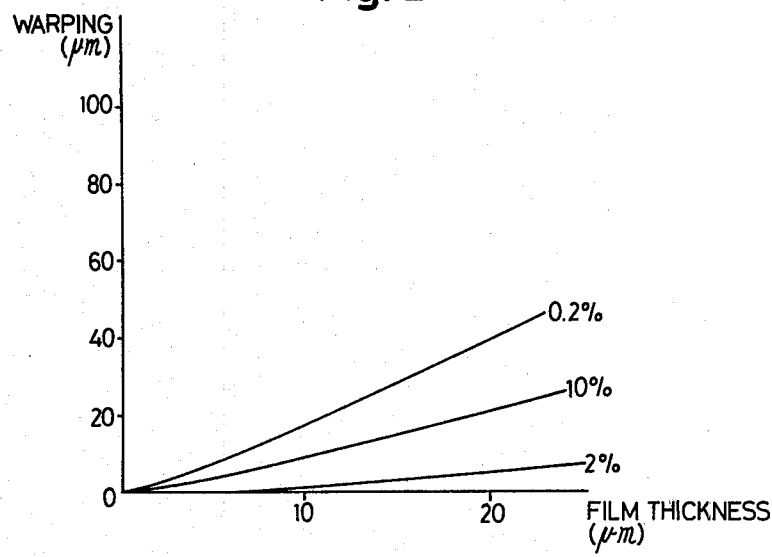
FIG. 2 is a graph illustrating the relationship between the thickness of a thin film and the extent to which a glass substrate is warped, which occurs when boron is doped into the thin film according to the present invention.

FIG. 2 illustrates the relationship between the thickness of a zinc oxide thin film deposited on a glass substrate and the extent of warping of the glass substrate for the cases where the dopant quantity in the target is 0.2 atom %, 2 atom % and 10 atom %. As will be readily appreciated from FIG. 2, the increase in the warping extent with increase in the film thickness was remarkably reduced as compared with the case where no doping was effected as in FIG. 1.

It will also be seen from the result mentioned above that in the case of boron, the most remarkable effect was produced when from 2 atom % to 3 atom % boron was doped into the target, and that for a quantity of boron in excess of 10 atom %, the effect was reduced on the contrary.

In an example wherein experiments were performed with respect to beryllium, too, similar results were obtained except for insertion loss. Generally, by using a dopant in the target within the range of from 0.2 atom % to 10 atom %, it is possible to reduce the internal stress tending to occur in a zinc oxide thin film and increase the resistivity of such a thin film.

Although this invention has been described with respect to some specific examples, it is to be understood that the invention is not restricted thereto but covers any and all modifications and changes which may be made within the scope of the appended claims.

What is claimed is:

1. A method of fabricating a zinc oxide thin film by a sputtering process comprising the step of sputtering, in an oxygen atmosphere, a dopant selected from the group consisting of boron, magnesium, silicon, gallium and germanium together with zinc onto a glass substrate to produce a zinc oxide thin film containing an amount of dopant effective to reduce the internal stress of said thin film sufficient to prevent fracture of the glass substrate at film thicknesses of up to 20 μm.

2. A method according to claim 1, wherein a body of zinc and a body of said dopant are separately provided as targets of a cathode; and said separate targets are simultaneously sputtered to thereby produce a zinc oxide thin film containing said dopant.

3. A method according to claim 1, wherein a cathode with a zinc target is provided; said dopant is buried in the zinc target of said cathode; and said target is sputtered to thereby produce a zinc oxide thin film containing said dopant.

4. A method according to claim 1, wherein said dopant is boron.

5. A method according to claim 1, wherein there is provided a cathode having a target formed from zinc containing boron in the range of from 0.2 atom % to 10 atom %; and said target is sputtered to thereby produce a zinc oxide thin film containing boron.

6. A method according to claim 5, wherein the cathode target is formed from zinc containing from 2 atom % to 3 atom % boron.

* * * * *